(12) United States Patent
Wiktor et al.

(10) Patent No.: US 8,154,117 B2
(45) Date of Patent: Apr. 10, 2012

(54) HIGH POWER INTEGRATED CIRCUIT DEVICE HAVING BUMP PADS

(75) Inventors: Stefan W. Wiktor, Raleigh, NC (US); Vladimir A. Muratov, Manchester, NH (US); Anthony L. Coyle, Parker, TX (US); Bernhard P. Lange, Freising (DE)

(73) Assignee: Texas Instruments Incorporated, Dallas, TX (US)

(*) Notice: Subject to any disclaimer, the term of this patent is extended or adjusted under 35 U.S.C. 154(b) by 260 days.

(21) Appl. No.: 12/347,522

(22) Filed: Dec. 31, 2008

(65) Prior Publication Data

US 2010/0164052 A1 Jul. 1, 2010

(51) Int. Cl.
*H01L 23/488* (2006.01)
(52) U.S. Cl. ............... 257/723; 257/737; 257/E23.008; 257/E23.021
(58) Field of Classification Search .......... 257/E23.008
See application file for complete search history.

(56) References Cited

U.S. PATENT DOCUMENTS

| 5,068,715 A | 11/1991 | Wade et al. |
| 7,183,658 B2 | 2/2007 | Towle et al. |
| 2007/0176798 A1* | 8/2007 | Kim .......................... 341/11 |

\* cited by examiner

*Primary Examiner* — Stephen W Smoot
(74) *Attorney, Agent, or Firm* — Steven A. Shaw; W. James Brady; Frederick J. Telecky, Jr.

(57) ABSTRACT

An integrated circuit (IC) includes a substrate having a semiconducting surface, a first array of devices on and in the semiconducting surface including first and second coacting current conducting nodes, a plurality of layers disposed on the substrate and including at a electrically conductive layers and dielectric layer, and a plurality of bump pads on or in the top surface of the dielectric layers. In the IC, the electrically conductive layers define electrical traces, where a first portion of the electrical traces contact a first portion of the bump pads exclusively to a portion of the first coacting current conducting nodes, where a second portion of the electrical traces contact a second portion of the bump pads exclusively to a portion of the second coacting current conducting nodes, and where the electrical traces are electrically isolated from one another by the dielectric layers.

19 Claims, 6 Drawing Sheets

HIGH POWER INTEGRATED CIRCUIT DEVICE HAVING BUMP PADS

FIELD OF THE INVENTION

The present invention relates to integrated circuit devices, and more specifically to integrated circuit devices for high power applications.

BACKGROUND

Increasing interest in high power integrated circuit (IC) applications has led to commercialization of various types of high power IC devices. In general, these IC devices comprise a multi-chip module (MCM) package which includes a plurality of ICs, such as a high power IC and a separate controller IC. In general, these MCM packages include connections for conveying high voltage and/or high current (collectively "high power") signals interspersed between the connections for conveying low voltage and current (collectively "low power") signals. Typically, the pins and/or leads of the MCM packages are typically the same dimensions, regardless of the type of signal being conveyed.

The high current densities for high power ICs generally result in heating of the MCM package, which can degrade IC performance. This problem is further exacerbated as the circuit density increases in the controller or high power ICs, resulting in significant heating in the MCM package. Accordingly, as the number of ICs in the MCM package increases, the greater these heating effects will generally be.

Several methods are typically used to address such heating issues. In some cases, cooling devices, such as heat sinks and fans are used to direct heat away from the MCM package to the environment. In other MCM package designs, the ICs are spaced apart on the MCM package surface to improve the thermal characteristics of the system. That is, the ICs are spread out over a larger area to improve heat dissipation. In other MCM packages, the high current signals are divided among several pins to reduce the amount of heating along a particular path in the MCM package. That is, the signal conductors are divided out over a larger area to reduce heating in individual conductors in the MCM package. In yet other MCM packages, improved thermal characteristics are provided by including relatively large metal land patterns on the bottom of the MCM package. Such large land patterns are used to interconnect a high power pad of the IC to a pin or lead of the MCM package while promoting the removal of heat from the MCM package.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

As the push towards smaller and denser ICs increases, MCMs for high power applications still generally require the use multiple ICs, limiting the amount of miniaturization possible. At the same time, these smaller and denser high power ICs generally require additional and/or more complex metallization layers for conducting the high power signals. Therefore, as current densities increase the heating during operation of such ICs, the heating in such MCMs also increases. Conventional methods for cooling the MCM, such as cooling devices, increased IC spacing, and metal land patterns, generally result in an increase in MCM size with only a minor reduction in MCM package heating. Other known methods, such as use of multiple pins and/or leads, generally result in an increased number of signal connectors on the MCM allocated to reliably carry the higher power signals. As a result the number of connectors available for low power signals is reduced or a redesign of the MCM package may be needed to provide a greater number of connectors. In addition, it has been increasingly more difficult to limit performance degradation of ICs in conventional MCMs. For example, as current densities increase due to increased drive currents in the ICs in an MCM, the amount of resistive heating in the MCM has also increased. In addition to causing resistive heating, these increased current densities and associated high voltages can further result in parasitic effects (e.g., parasitic impedances) that hinder current flow in portions (e.g., logic portions) of the MCM, typically decreasing the overall efficiency of the MCM and/or requiring that control circuitry be included in a separate control IC.

The Present Inventors have discovered that many of the limitations preventing effective cooling and aggressive miniaturization of high power ICs and MCMs can be overcome by shunting the high power signals generated by high power devices on an IC through the package or workpiece rather than through metallization layers in the IC. In particular, current conducting nodes of high power devices in an IC, such as the source and drain nodes of a MOS transistor, can be connected to bump pads on the surface of the IC rather than to other devices in the IC via metallization layers, as in a conventional the IC. The workpiece can include the conducting bands on a workpiece surface, where the conducting bands are configured for contacting the bump pads of the IC associated with the high power nodes. Accordingly, the currents at the coacting current conducting nodes of the high power devices in the IC are combined in the workpiece, rather than in the IC. The term "coacting nodes", as used herein, refers to nodes of an array of transistors which are coupled together to provide an input or output node. Consequently, heating in the IC is reduced by reducing high current density signals on the IC. Furthermore, as the number of high power signals is reduced, parasitic effects due to the high power signals are also reduced, allowing closer placement of control ICs in the MCM or allowing control circuits for the high power devices to be included on the same IC. In addition, by combining currents from high power devices in the workpiece, rather than in the IC, different workpiece configurations can be provided for a single IC design, increasing application flexibility for the IC and reducing costs for the MCM or other IC devices.

In the various embodiments of the present inventions ICs, IC devices, and methods for designing IC devices are provided. In one embodiment of the present invention, an IC can include a substrate having a semiconducting surface, a first array of devices on and in the semiconducting surface. Each of the devices in the first array includes at least first and second coacting current conducting nodes and a plurality of layers disposed on the substrate. The plurality of layers includes a plurality of electrically conductive layers and a plurality of dielectric layers having a top surface, and a first plurality of bump pads on or in the top surface of the dielectric layers at a plurality of first bump pad locations. The plurality of electrically conductive layers defines a first plurality of electrical traces. A first portion of the electrical traces can electrically contacting at least a first portion of the first plurality of bump pads exclusively to a portion of the first coacting current conducting nodes. A second portion of the electrical traces can electrically contacting at least a second portion of the first plurality of bump pads exclusively to a portion of the second coacting current conducting nodes. In the IC, the first plurality of electrical traces are electrically isolated from one another by the plurality of dielectric layers.

In another embodiment of the present invention, an IC device, including a workpiece for the IC, is provided. The workpiece can have a workpiece surface facing the top surface. The workpiece includes a plurality of electrically conductive contacts disposed on the workpiece surface, the plurality of electrically conductive contacts includes a plurality of contact bands, each of the plurality of contact bands extending over at least a portion of the workpiece surface, each of the plurality of contact bands at least partially overlapping at least two of the first plurality of bump pad locations, and each of the plurality of contact bands physically and electrically contacting a portion of the first plurality of bump pads.

In yet another embodiment of the present invention, the IC can further include a second plurality of devices on and in the semiconducting surface, and a second plurality of bump pads on or in the top surface at second bump pad locations. The plurality of electrically conductive layers further define a second plurality of electrical traces. The second plurality of electrical traces electrically couples at least one of the second plurality of devices to a control nodes of the first plurality of devices, wherein the first and the second plurality of electrical traces are electrically isolated.

In still another embodiment of the present invention, a method for designing an IC device is provided. The method can include receiving a design for the IC including a plurality of bump pads, where each of the bump pads is exclusively and electrically connected to a portion of the coacting current conducting nodes of a first plurality of devices in the IC. The method can also include determining an interconnection arrangement for the first plurality of devices. The method further includes selecting one of a plurality of workpieces, where each of the plurality of workpieces provides a different arrangement of contact bands for connecting the coacting current conducting nodes of the IC.

DETAILED DESCRIPTION

Figure 1:
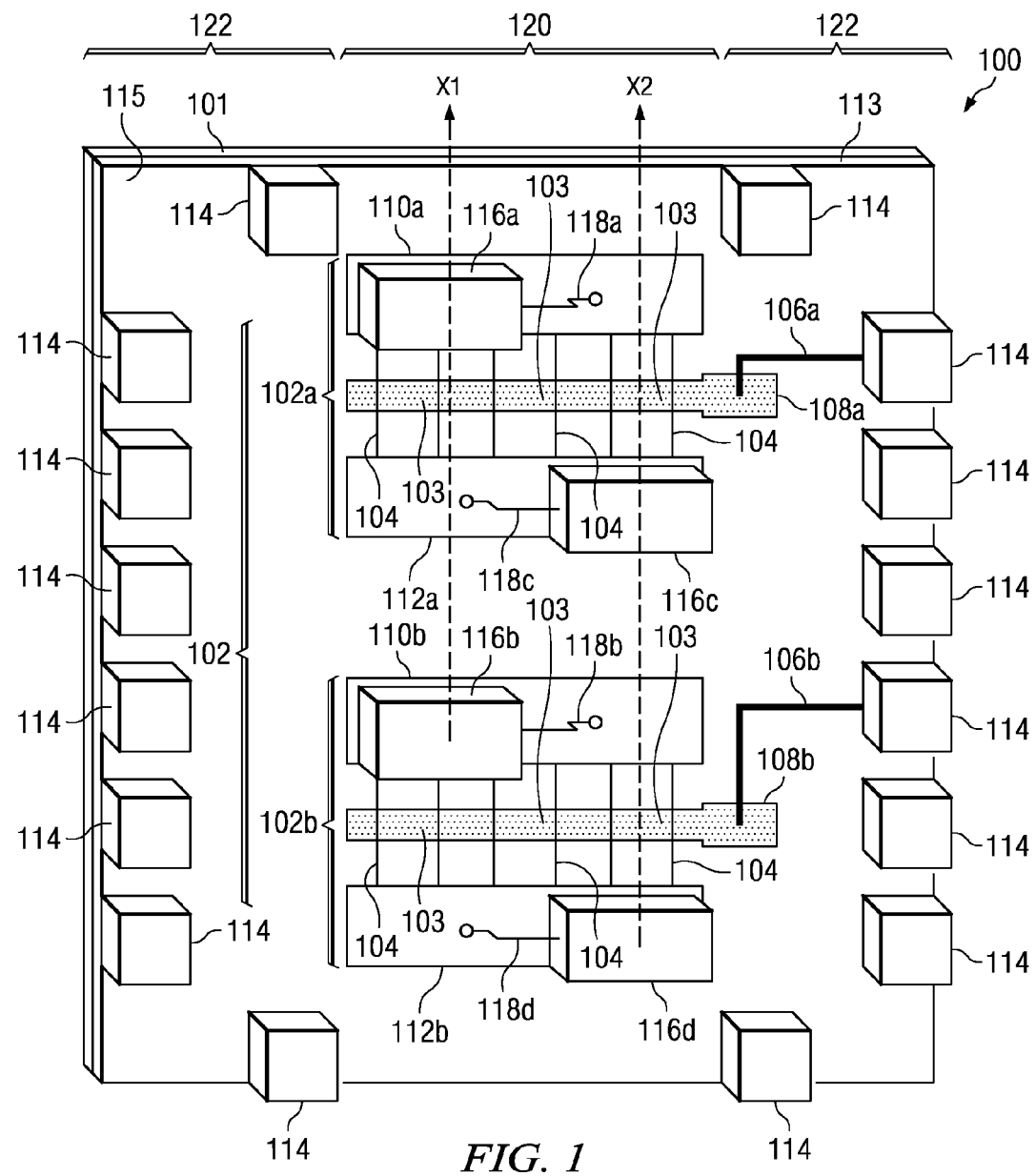
FIG. 1 is a schematic view of an IC including an array of transistors configured according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the present invention provide IC devices that include high power devices with reduced heating effects and reduced parasitic effects as compared to conventional IC devices. Typically, a single IC device comprising a combination of ICs, including one or more ICs conducting high amounts of current or operating with high voltage signals can result in several problems. For example, a conventional high power IC device typically includes an array of high voltage transistors and a logic portion. The terms "high power", "high current", or "high voltage", as used herein with respect to devices in an IC, refer to devices configured for handling at least 10× current levels as compared to conventional logic devices in the IC. These can be on the same or separate ICs in the high power device. The array in such an IC device typically includes a plurality of transistors connected in parallel so as to collectively provide the high power output signals needed. In some conventional IC devices, logic portion in the same IC as the array of high power transistors can transmit control signals along an interconnect coupled to control nodes of the array, such as a common gate conductor for the array of transistors. The source and drain regions for the array of transistors can be coupled to source conductor regions and drain conductor regions, respectively. These conductor regions are then typically coupled to one or more bump pads of the IC via one or more interconnects. As previously described, in a conventional IC, multiple bump pads can be connected to the same high current or high voltage signal to reduce the current density in each of the bump pads. The bump pads can then be coupled to an IC package, a printed circuit board, or any other workpiece (not shown) having interface features for contacting the bump pads. In such conventional ICs, interconnects are typically formed using one or more metallization layers of the IC.

As previously described, one difficulty with this type of conventional IC arrangement is the introduction of parasitic effects. For example, if logic portion or interconnects connected thereto are positioned in proximity to common conductors or interconnects for the array of high power transistors, the difference in voltage or current can result in the introduction of parasitic effects, which can result in signal degradation, crosstalk, or signal upset for electrical signals in the logic portions or interconnects connected thereto. Accordingly, in a conventional high power IC device, the logic portion is generally placed in a separate IC in the MCM. Unfortunately, even though the logic portion is no longer susceptible to significant parasite effects, degradation of the logic portion can still occur, name via heating effects.

Heating effects in the logic portion generally occur because of the high current densities associated with the high voltages typically associated with the array of high power transistors. In particular, because the currents of the array of high power transistors are combined at some point within the IC, a significant amount of resistive heating due to this common connection generally occurs. Therefore, even when the high density current from the array of transistors is divided among a few interconnects of the IC, the amount of resistive heating occurring is still typically significant. Furthermore, as the number of high power transistors increases, this resistive heating is typically exacerbated. As a result, not only is the IC containing the high power transistors heated, as previously described for a MCM package, but other ICs in an associated IC device will generally also be heated, resulting in temperature related device performance degradation. As a result, even when the logic portions are relocated to a different IC in an IC device, the heating caused by the IC containing high power devices still generally degrades performance of a logic portion in a separate IC of the MCM. Furthermore, such heating can result in acceleration of reliability failures in both the logic portions and within the array of high power transistors in the MCM.

Accordingly, to reduce both parasitic and heating effects in high power IC devices, embodiments of the present invention of the invention provide IC devices in which the coacting current conducting nodes of parallel high current devices in a high power IC, such as the source and drain nodes of high voltage MOS transistors, are physically and electrically connected to different bump pads on the surface of the IC rather than via a common conductor in the IC metallization layers, as in a conventional high power IC in a IC device. As previously described, the term "coacting nodes", as used herein, refers to nodes of an array of transistors which are coupled together to provide an input or output node. For example, in the case of a high power IC, the source and drain nodes of the high power transistors are generally coacting. That is, two or more of the transistors are generally connected in parallel to provide a single high power output signal or to receive a single high power input signal provided to the IC.

However, in the various embodiments of the present invention, the coacting current conducting nodes of high power devices in the high power IC are not connected in parallel within the IC, as conventionally done for coacting transistors using a metallization layer. Instead, a workpiece, separate from the IC, is provided and configured to include electrically conductive features for combining signals generated and received by high power devices with coacting current conducting nodes of the high power IC in the workpiece. As a result, electrical traces in the high power IC operate with reduced current densities, resulting in reduced heating in the IC and in an IC device. Furthermore, the reduced current densities in the IC also provide reduced parasitic effects within in the IC. Such reduced parasitic effects generally permit relatively sensitive circuits, such as control or logic circuits, to be positioned in proximity to a high power IC in the workpiece or even within the same die as high power IC.

FIG. 1 is a schematic view of an IC 100 including an array of transistors 102 configured according to an embodiment of the invention. The IC can include a substrate 101 having a semiconducting surface. In the substrate, an array of transistors 102 can be formed includes a first array portion 102a and a second array portion 102b. Each of the array portions 102a, 102b includes at least one of transistors 103, at least one source conductor region 110a, 110b, and at least one drain conductor region 112a, 112b. The transistors 103 are formed from at an overlap of one of gate electrode regions 108a, 108b and source/drain regions 104. The source and drain conductor regions 110a, 110b, 112a, 112b, can be coupled to respective nodes of the source/drain regions 104 for transistors 103 via one or more interconnection and/or metallization layers of the IC 100. The metallization layers of the IC 100 are then electrically and physically connected to separate ones of first bump pads 116a-116d (collectively 116). Additionally, the source and drain conductor regions 110a, 110b, 112a, 112b can also be formed in the interconnection layers of the IC 100.

The interconnection or metallization layers can be formed within one or more dielectric layers 113 formed on the IC 100. The gate electrode regions 108a, 108b, can be coupled to a control signal received at second bump pads 114 of the IC 100 via interconnects 106a, 106b, respectively, also formed on a top surface 115 of in the dielectric layers 113 of the IC 100. That is, the second bump pads 114 can be at least partially within a top surface 115 of the dielectric layers 113.

Interconnection or metallization layers of an IC, as used herein, refer to the arrangement of layers of electrically conductive materials interspersed between layers of dielectric materials in conventional ICs. That is, the electrically conductive materials can be formed, via additive or subtractive methods, to provide a series of electrical traces between the various devices formed on the IC. Accordingly, interconnection or metallization layers can include any arrangement of interconnect lines and interconnect vias using any number of levels or layers of electrically conductive materials. In the various embodiments of the present invention, the interconnect lines and vias can be formed from any electrically conductive materials, include metals, metal alloys, electrically conductive semiconductors, silicide materials, or any combination thereof.

Although the conductor regions 110a, 110b, 112a, 112b are each shown as interconnecting only three nodes of transistors 103 in each of array portions 102a and 102b, the present invention is not limited in this regard. In the various embodiments of the present invention, the conductor regions 110a, 110b, 112a, 112b can be configured for interconnecting any number of transistor nodes. The number of nodes coupled to one conductor region can be selected based on a maximum amount of heating allowed for the particular IC. That is, the number and size of conductor regions can be selected such that the amount of resistive heating due to a current in any one particular electrical path associated with a conductor region does not exceed a pre-defined limit. Furthermore, the number and dimensions of the conductor regions 110a, 110b, 112a, 112b can be selected such that for a worst case current density, the parasitic effects on an adjacent portion of the IC are significantly reduced.

As previously described, one aspect of the present invention provides for limiting the number the high current conducting nodes of parallel devices in the IC that are interconnected. That is, if the array portions 102a and 102b operate in parallel or cooperatively, the various embodiments of the present invention provide for limiting the number of a common connections between coacting nodes within the IC. Instead, some of these coacting nodes are physically and electrically connected to separate bump pads in the IC. For example, as shown in FIG. 1, no interconnection is provided from conductors 110a and 112b to conductors 110b and 112b, respectively, for IC 100 via metallization layers as provided in a conventional IC. Instead, as shown in FIG. 1, each of the conductors is electrically and physically connected to separate ones of first bump pads 116a-116d (collectively 116) via separate interconnects 118a-118d (collectively 118), respectively, formed on or in a top surface 115 of the dielectric layers 113 on the IC 100. That is, the first bump pads 116 can be at least partially within the top surface 115 of dielectric layers 113.

In the various embodiments of the present invention, the first bump pads 116 can be substantially larger, such as at least twice the area of second bump pads 114 because the commutated currents are larger. That is, the size of the first bump pads 116 is selected to handle the increased current density for each of the first bump pads 116. Therefore, to provide a substantially low current density, the size of the first bump pads 116 is selected to be as large as possible to provide a low impedance. For example, the second bump pads can be selected to have dimensions of 300 um by 100 um. In contrast, the size of the second bump pads 114 is typically reduced as much as possible, although usually limited by manufacturing limitations, such as 50-100 um. In the case of the second bump pads 114, since they generally conduct only control voltages or low current signals, their increased impedance is typically not significant. Accordingly, if transistors 103 generate an output current at conductors 110a and 110b, to limit the current density in any one portion of the IC 100, and thus limit resistive heating and parasitic effect, the interconnects 118 associated with each of conductors 110a and 110b are physically and electrically isolated. Consequently, the first bump pads 116 coupled to each of these interconnects 118 are kept also physically and electrically isolated. Therefore, each of first bump pads 116 conducts only the portion of current present in the associated one of conductors 110a and 110b, not a combined current from all of transistors 103 in the array 102.

In the same way, the amount of current provided to the IC 100 along any one electrical path can also be limited. For example, if transistors 103 receive an input current at conductors 112a and 112b, to limit the current density in any one portion of the IC 100, and thus limit resistive heating and parasitic effects, the interconnects 118 associated with each of conductors 112a and 112b are kept physically and electrically isolated. Consequently, the first bump pads 116 coupled to each of these interconnects 118 are also kept physically and electrically isolated. Therefore, even though the total amount of current conducted by the IC is sufficient to cause resistive heating or parasitic effects in a conventional IC with the same number of transistors, the currents at each of conductors 112a and 112b, at each of first bump pads 116 and each of interconnects 118 associated with conductors 112a and 112b is only a fraction of this input current, not the total input current seen by all transistors 103 in the array 102.

Figure 2:
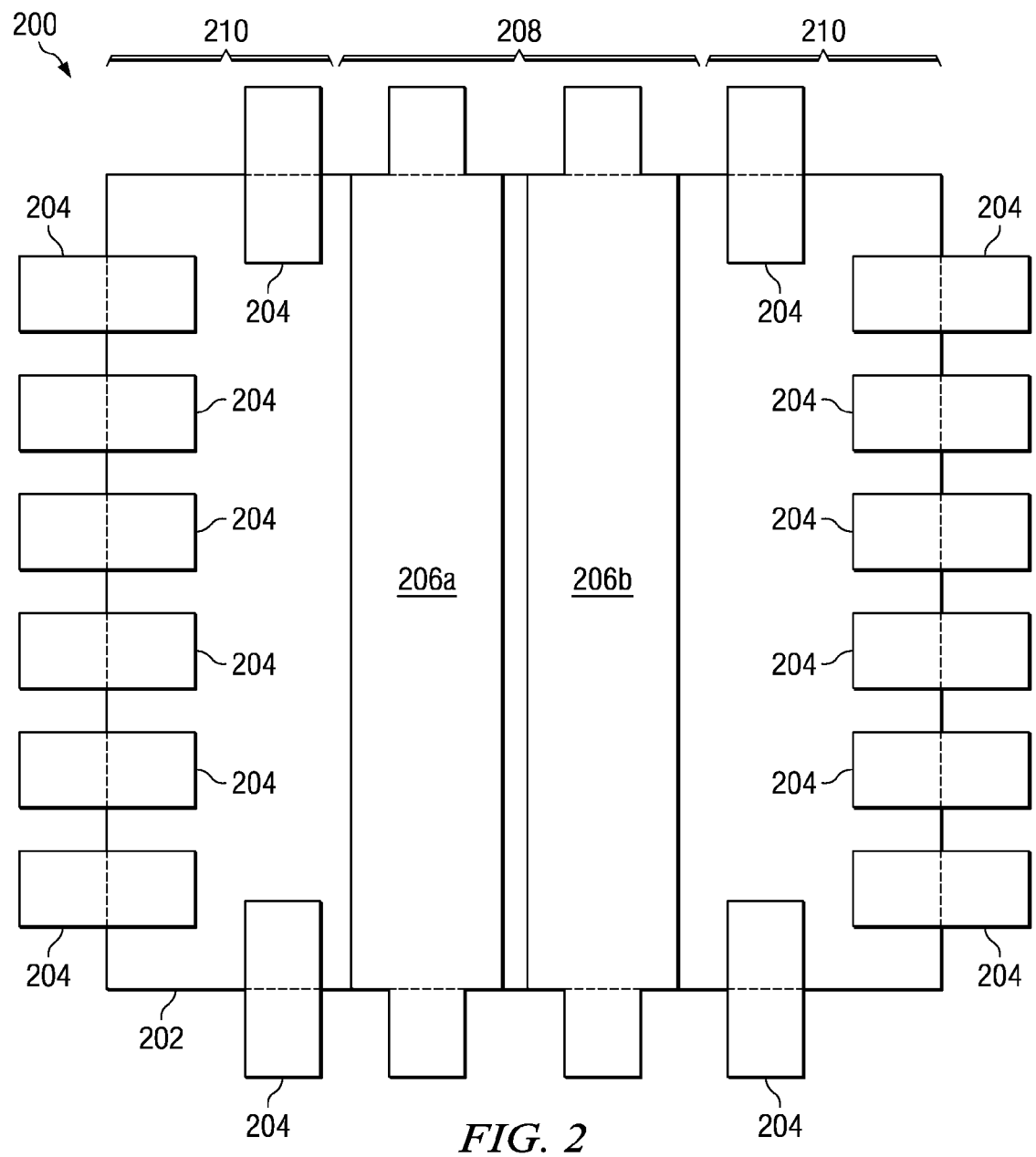
FIG. 2 shows a top-down view of the IC contacting surface of a workpiece for mounting the IC in FIG. 1.

As described above, in the various embodiments of the present invention, such currents are instead combined within the workpiece which is attached to the IC. In particular, some embodiments of the present invention provide contact bands on the surface of the workpiece, along with conventional contact pads, for the various bump pads on the IC. For example, FIG. 2 shows a top-down view of the IC contacting surface of a workpiece 200 for mounting the IC 100 shown in FIG. 1. As shown in FIG. 2, the workpiece 200 includes a substrate 202. The workpiece 200 also includes a plurality of electrically conductive features on the contacting surface. Although the workpiece 200 is shown in FIG. 2 as including leads extending beyond the edges of substrate 202, the invention is not limited in this regard. In some embodiments of the present invention, the workpiece 200 can comprise leaded or leadless packages. Alternatively, the workpiece can comprise a electronic substrate including a plurality of electrically conductive features on a surface. The term "electronic substrate", as used herein, refers to any type of printed circuit board (PCB) used for forming package substrates. In the various embodiments of the present invention of the present intervention, electronic substrates can be constructed using a variety of techniques. By way of example, and not by way of limitation, electronic substrates can be constructed using laminate substrate technologies, including rigid and/or flexible laminate technologies, and ceramic substrate technologies, including thin film, thick film, and co-fired (HTCC, LTCC) ceramic technologies.

Workpiece 200 includes contact leads 204 positioned on the substrate 202 to correspond to the locations of the second bump pads 114 in IC 100. Additionally, the workpiece 200 also includes contact bands 206a, 206b (collectively 206) positioned to correspond to the locations of the first bump pads 116 in IC 100. The term "contact band" as used herein, refers to an electrically conductive feature on the IC contacting surface of the workpiece configured for contacting at least two bump pads of the IC. Although only two contact bands 206 are shown in FIG. 2, the present invention is not limited in this regard. For example, in the IC shown in FIG. 1, only two common nodes, a source node and an drain node are shown. However, in other embodiments of the present invention, the number of nodes can be smaller or larger, depending on the type of high power devices in the IC. Accordingly, in such embodiments of the present invention, a contact band would be provided for each of the common nodes in the IC.

Figure 3:
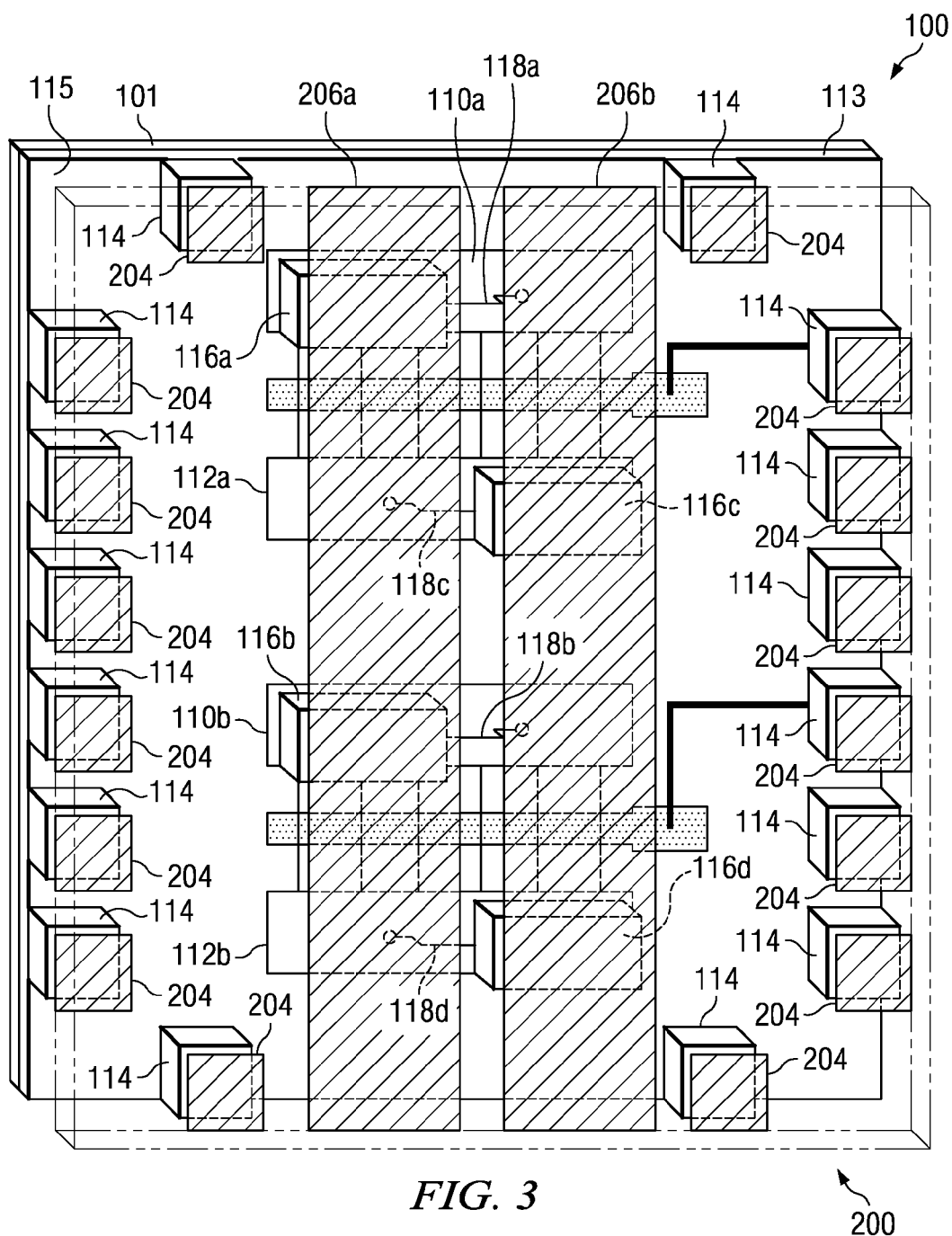
FIG. 3 shows a perspective view of the IC in FIG. 1 and the workpiece in FIG. 2 prior to contact.

When IC 100 is mounted on workpiece 200, each of contact bands 206 interconnects any of first bump pads 116 each of contact bands 206 overlaps, while contact leads 204 are used to contact second bump pads 114. This is conceptually illustrated in FIG. 3. FIG. 3 shows a perspective view of the IC 100 and the workpiece 200 just prior to contact. Once IC 100 is attached to workpiece 200, each of the contact leads 204 overlaps at least a portion of one of the second bump pads 114 to provide a physical and electrical connection between one of contact leads 204 and one of second bump pads 114. Similarly, at least a portion of each of contact bands 206 overlaps at least a portion of two of the first bump pads 116. Accordingly, the contact leads 204 and the contact bands 206 can be dimensioned to match the dimensions of the first 114 and second 116 bump pads, respectively. For example, for first bump pads 116 having dimensions of 300 um by 100 um, the contact bands 206 can have a width of at least 300 um to overlap one of the first bump pads 116.

Since each of contact bands 206 overlaps at least two of bump pads 116, not only is a physical and electrical connection between a contact band 206 and one of bump pads 116 provided, but also a physical and electrical connection between any of bump pads 116 overlapped by the same one of contact bands 206. As a result, coacting nodes of the transistors 103 are interconnected at one of contact bands 206 instead of a common node within a conventional IC.

For example, as shown in FIG. 3, conductor 110a is connected to contact band 206a via interconnect 118a and bump pad 116a. Conductor 110b is also connected to contact band 206a via interconnect 118b and bump pad 116b. Therefore, a common node for conductors 110a and 110b occurs at contact band 206a in the workpiece 200, as opposed to a location within a conventional IC. Similarly, conductor 112a is connected to contact band 206b via interconnect 118c and bump pad 116c and conductor 112b is connected to contact band 206b via interconnect 118d and bump pad 116d to provide a common node at contact band 206b in the workpiece 200. Therefore, regardless of the total amount of current provided or collected at contact bands 206a or 206b, the current along any electrical path in the IC 100 will generally only be a portion of this total current. Accordingly, the amount resistive heating and parasitic effects along each of the electrical paths in IC 100 is limited, reducing overall heating and parasitic effects in the IC 100.

In the various embodiments of the present invention, the locations for the contact leads 204, the contact bands 206 and associated one of bump pads 114, 116, can be selected to conform to the arrangement of transistors 103 in the IC 100. For example, in the case of high power applications, an array of transistors is typically arranged in a pattern within a particular region of the IC. Accordingly, based on this pattern, the bump pads associated with particular types of coacting nodes can be arranged along a same direction or axis. For example, as further shown in FIG. 1, bump pads 116a and 116b are arranged along the same longitudinal axis, shown as X1 in FIG. 1. Bump pads 116c and 116d are arranged along a second longitudinal axis, shown as X2 in FIG. 1 and parallel to X1. Accordingly, in the workpiece 200, the contact bands 206a and 206b can be configured to extend along the same direction in a first region 208 that overlaps the corresponding bump pads 116 in a first region 120 of the IC 100. In contrast, the other bump pads 114 can be arranged in other regions 122 of the IC 100 and the workpiece can provide corresponding contact leads 204 in second regions 210 of the workpiece 200. Furthermore, in the case of leaded or leadless packages, the contact bands 206a and 206b can continue to extend in along longitudinal axes X1 and X2, respectively, to at least edge of substrate 202. Accordingly, electrical signals for each of array portions 102a and 102b can be provided or collected along the edge of substrate 202, regardless of where bump pads 116 contact one of the contact bands 206.

Such an arrangement provides an additional advantage. In particular, by standardizing the arrangement of bump pads (i.e., providing a fixed number of rows and columns of bump pads on an IC), different arrangements of contact bands can be provided to allow different interconnection arrangements for high power transistors in an array. That is, since transistor nodes, and thus transistors, are not connected together until connected by a contact band in the workpiece, different connection arrangements of the transistors are possible, even after fabrication of the IC is completed. In particular, by altering the path, width, or length of each of the contact bands in the workpiece, different groups of transistors in the array on the IC can be contacted by different contact bands. As a result, alternate workpieces can be provided at the packaging level to allow a single IC design to be used with for a large number of different applications. Accordingly, costs can be reduced, as the design and manufacture of workpieces is significantly less expensive as compared to the design and manufacture of multiple IC designs. The idea of an alternate workpiece is conceptually illustrated for IC 100 in FIG. 4.

Figure 4:
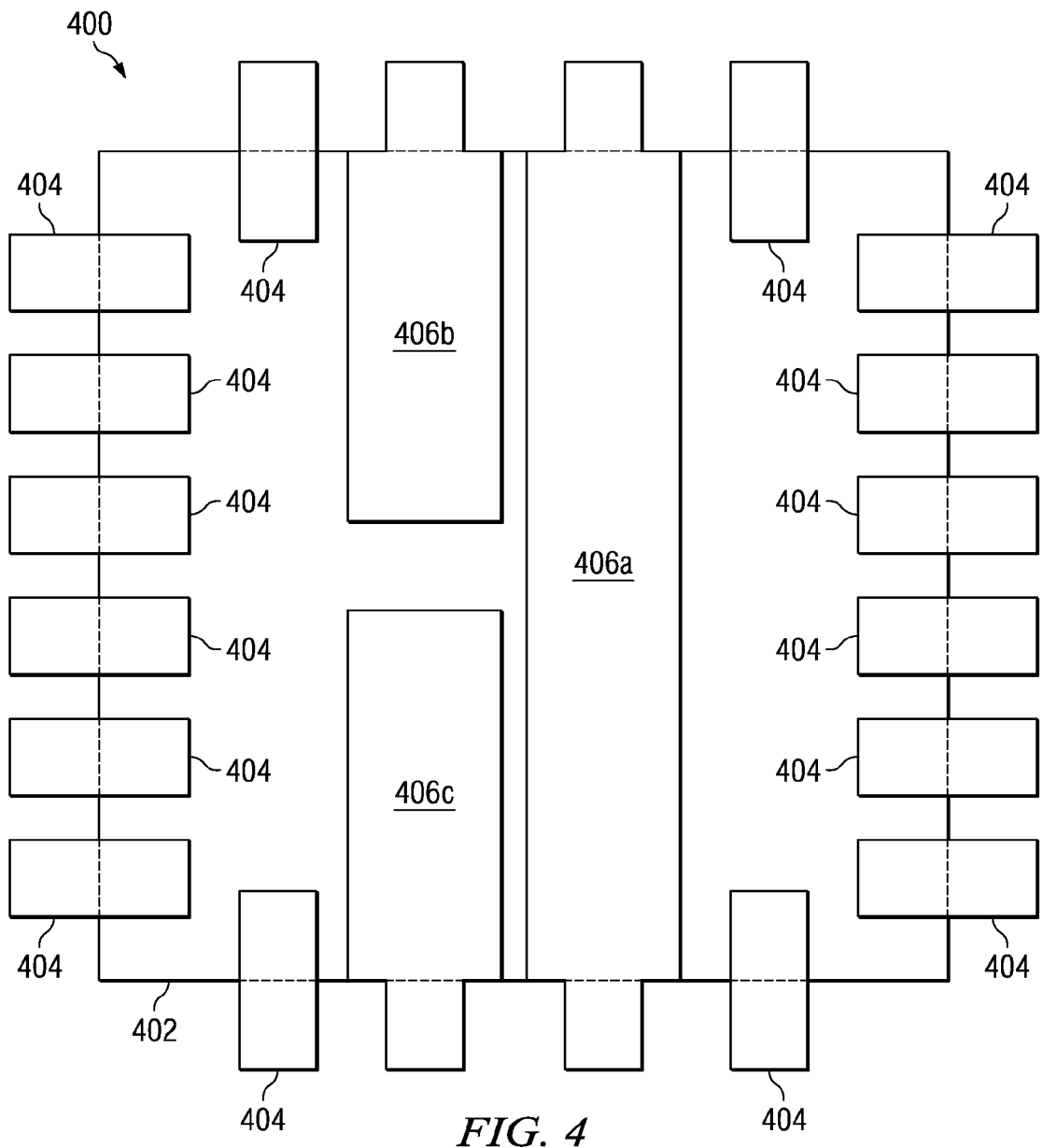
FIG. 4 is a top-down view of the IC contacting surface of an alternate workpiece for the IC in FIG. 1.

FIG. 4 is a top-down view of the IC contacting surface of an alternate workpiece 400 for the IC 100 shown in FIG. 1. As previously described for workpiece 200 in FIG. 2, workpiece 400 in FIG. 4 includes a substrate 402. The workpiece 400 also includes a plurality of conductive features on the contacting surface, including contact leads 404 positioned on the substrate 402 to correspond to the locations of the second bump pads 114 in IC 100. Also as shown in FIG. 4, the IC contacting surface of workpiece 400 includes contact bands 406a, 406b, 406c (collectively 406), each extending to at least one edge of the workpiece substrate 402. In contrast to workpiece 200 in FIG. 2, workpiece 400 in FIG. 4 includes a contact band 406a extending to opposite edges of the substrate 402 and contact bands 406b, 406c extending to only one edge of the substrate. The contact bands 406 are positioned to correspond to the locations of the first bump pads 116 in IC 100. Although the workpiece 400 is shown in FIG. 4 as including leads extending beyond the edges of substrate 402, the invention is not limited in this regard.

Such alternate workpiece arrangements allow an alternate configuration of transistors in an IC device. For example, the arrangement in FIG. 4 permits a series arrangement of the first array portion 102a and the second array portion 102b of IC 100 in FIG. 1 instead of the parallel arrangement provided by the workpiece 200 in FIG. 2. In the case of the arrangement in FIG. 4, once the IC 100 is mounted on workpiece 400, contact band 406b provides electrical contact to a first current node for the transistors in array portion 102a. Contact band 406c provides electrical contact to a second current node for the transistors in array portion 102b. Contact bad 406a provides electrical contact to a third current node of the transistors in both array portions 102a and 102b. Accordingly, a series path is provided from contact band 406b to contact band 406a and from contact band 406a to contact band 406c. Therefore, in the various embodiments of the present invention, for a particular IC design, a number of different workpiece designs can be provided to provide different transistor arrangements for a particular transistor array design and a particular arrangement of bump pads on the IC.

Figure 5:
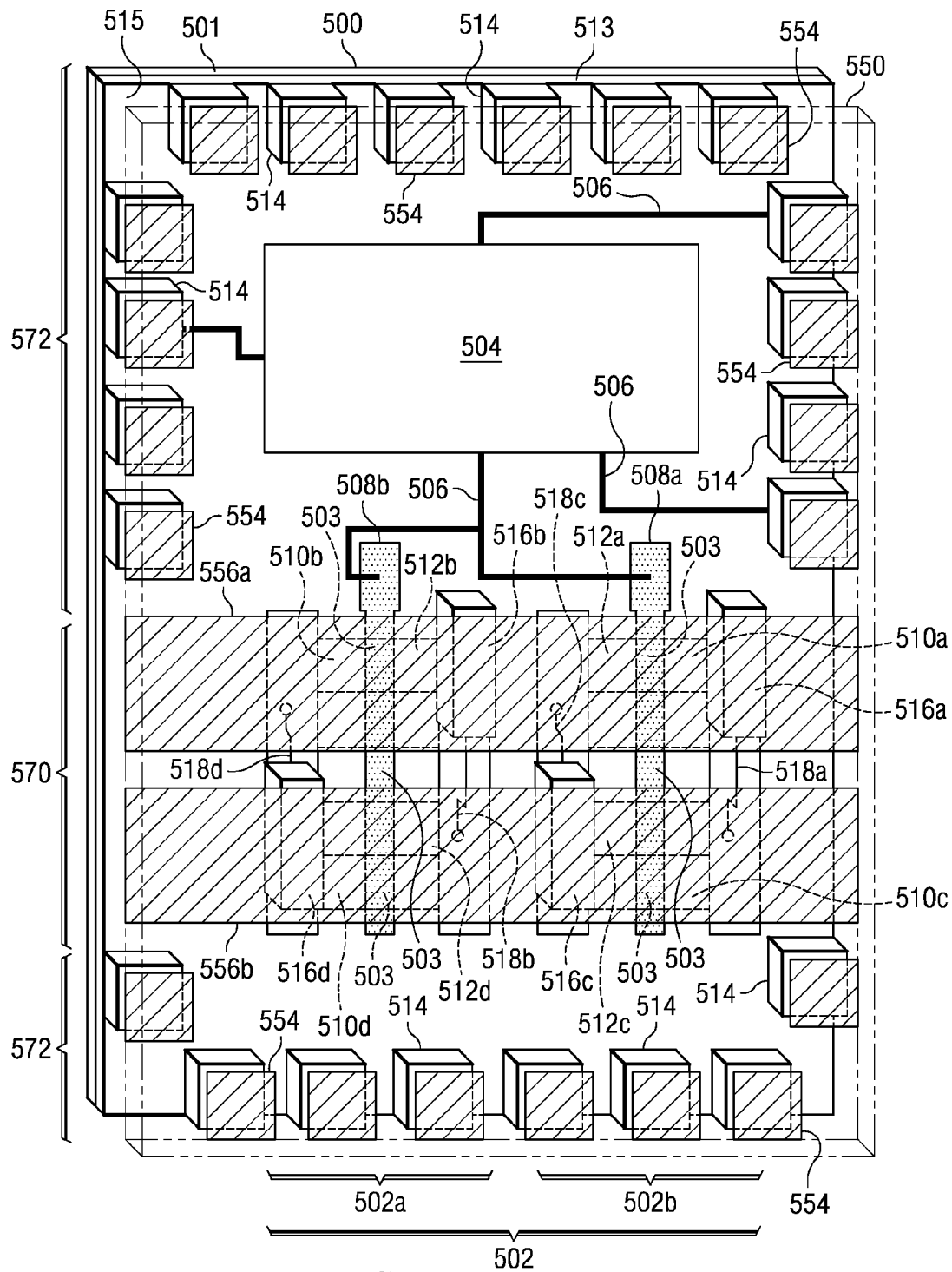
FIG. 5 shows a perspective view of an IC and a workpiece prior to contact according to another embodiment of the present invention.

The inclusion of the contact bands in the workpiece provides additional advantages. As previously described, because high currents are combined outside the IC, the parasitic effects within the IC can be significantly reduced. Accordingly, such a reduction in parasitic effects allows a logic portion to be placed within the same IC as an array of high voltage transistors. This is shown in FIG. 5. FIG. 5 shows a perspective view of an IC 500 and a workpiece 550 prior to contact. As shown in FIG. 5, the IC 500 includes both a logic portion 504 and an array of high voltage transistors 502.

As in FIG. 1, the array of transistors 502 in IC 500 includes a first portion 502a and a second portion 502b of transistors 503. Each of portions includes at least one of transistors 503, at least one gate electrode region 508a, 508b, at least one source conductor region 510a, 510b, and at least one drain conductor region 512a, 512b, for connecting at least a portion of the transistors in parallel. The source and drain conductor regions 510a, 510b, 512a, 512b, can be coupled to respectively source or drain nodes of the transistors 503 via one or more interconnection and/or metallization layers of the IC 500. Additionally, the source and drain conductor regions 510a, 510b, 512a, 512b can be formed in the interconnection layers of the IC 500. The gate electrode regions 508a, 508b, can be coupled to a control signal received from logic portion 504 of the IC 500 via interconnects 506 also formed in the interconnection layers of the IC 500.

Unlike the conventional IC device described above, the logic portion 504 is not significantly affected by parasitic effects in the IC 500 due to the reduction of high current signals within the IC 500 and/or in proximity to logic portion 504. As in the IC 100 in FIG. 1, the coacting nodes of the transistor array 502 are electrically connected to separate bump pads in the IC 500. For example, as shown in FIG. 5, no interconnection is provided from conductors 510a and 512b to conductors 510b and 512b, respectively, via metallization layers within the IC 500. Instead, as shown in FIG. 5, each of the conductors is electrically connected to separate ones of first bump pads 516a-516d (collectively 516) via separate interconnects 518a-518d (collectively 518), respectively, formed on or in a top surface 515 of dielectric layers 513 of the IC 500. The interconnection or metallization layers can be formed within one or more dielectric layers 513 formed on the IC 500. Accordingly, if transistors 503 generate an output current at conductors 510a and 510b, to limit the current density in any one portion of the IC 500, and thus limit resistive heating and parasitic effects that can affect logic portion 504, the interconnects 518 associated with each of conductors 510a and 510b are electrically isolated. Consequently, the first bump pads 516 coupled to each of these interconnects 518 are also electrically isolated. Therefore, each of first bump pads 516 conducts only the portion of current present in the associated one of conductors 510a and 510b, not a combined current from all transistors 503 in the array 502. Therefore, by combining currents outside the IC 500, such as on a separate workpiece 550, the parasitic effect potentially affecting interconnects 506 and/or logic portion 504 are significantly reduced, since any interconnects associated with of the transistor array 502 carries only a portion of the total current for the high power transistors 503 in the IC 500.

The use of a workpiece having contact bands to combine signals from multiple high voltage transistors in a high power IC also offers additional advantage. In particular, the use of contact bands in accordance with the various embodiments of the present invention increases the number of bump pads available for providing input and output signals for a logic portion on the IC. For example, conventional IC layout techniques (and conventional packaging techniques) configure common nodes to output signals via multiple bump pads (or multiple pins or leads in a package), to reduce the amount of current provided by any one connection. Unfortunately such a configuration results in a lower number of connections available for logic portions, reducing the number of control signals available. In contrast, as shown in FIG. 5, since the contact bands 556a, 556b (collectively 556) are utilized instead for directing high current to and from the IC 500 and the width of the contact pads is generally limited to the width of a few bump pads at the most. The remainder of the perimeter of the IC 500 can be populated with bump pads 514 for connecting to the logic portion 504 of the IC 500 and also formed on or in a top surface 515 of dielectric layer 513 on the IC 500. Accordingly, the functionality of such integrated logic portions can be increased, allowing greater flexibility in the operation of the array of transistors 503 and allowing for additional alternate configurations for the contact bands 556 in the workpiece 550.

Furthermore, to further reduce potential parasitic effects in logic portion 504, in some embodiments of the present invention, the first bump pads 516 and associated interconnects 518 can be confined to a first device region 570 of the IC 500 associated with the array 502. Similarly, the contact bands 556 can be confined to a corresponding region of the associated workpiece 550. As a result, any potential parasitic effects are generally limited to the first device region 570 of the IC 500 or to portions of other device regions 572 of the IC 500 adjacent to the first device region 570.

Figure 6:
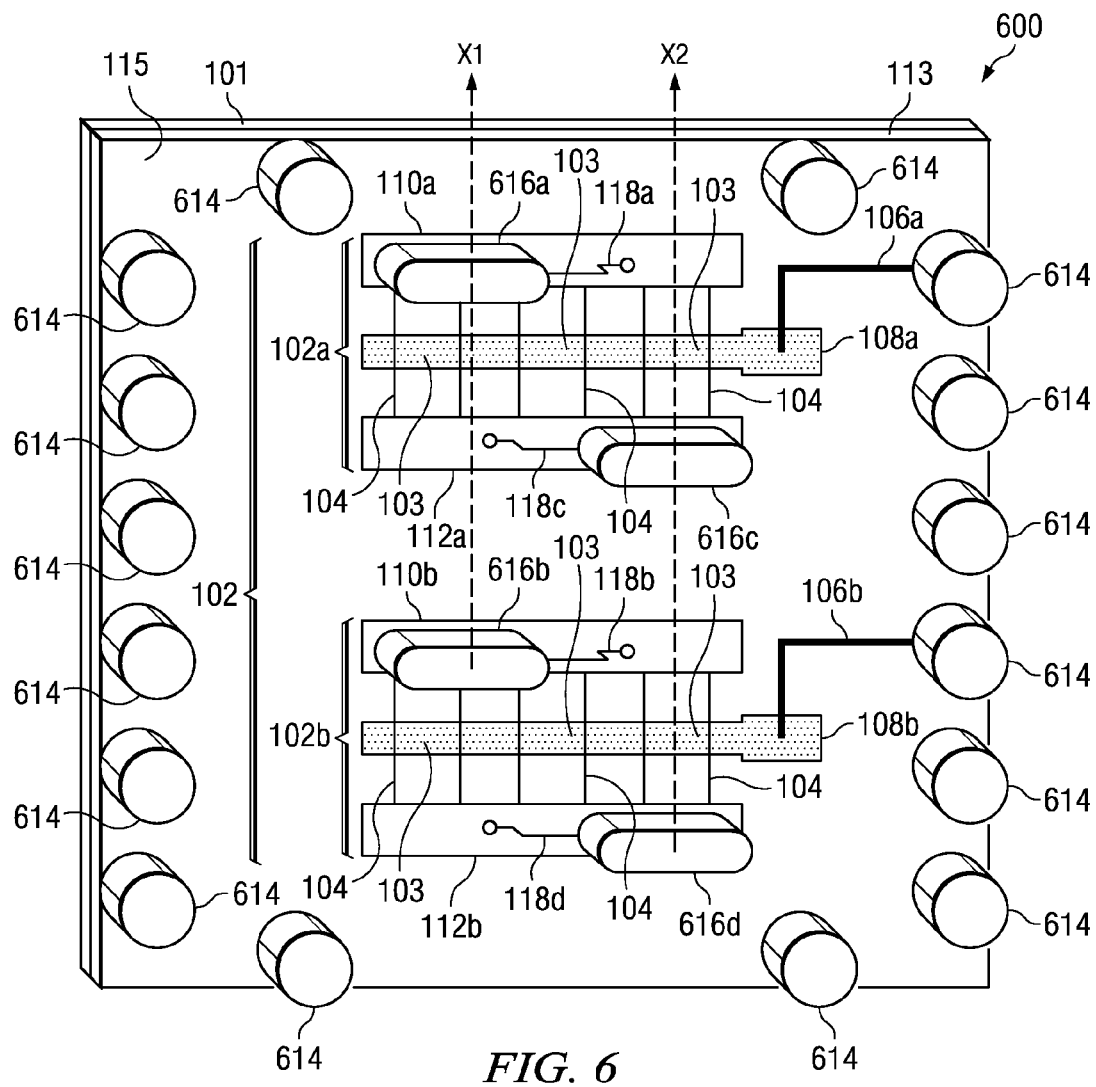
FIG. 6 is a schematic view of an IC including an array of transistors configured according to an embodiment of the invention.

In the various embodiments of the present invention, the bump pads can be patterned in a variety of shapes. For example, as shown in FIGS. 1, 3, and 5, the bump pads are either square or rectangular. However, the present invention is not limited in this regard. For example, as shown in FIG. 6, the bump pads can be formed in other shapes. FIG. 6 is a schematic view of an IC 600 including an array of transistors 102 configured according to an embodiment of the invention. IC 600 is configured similarly to IC 100. However, as shown in FIG. 6, the IC 600 is shown as having second bump pads 614 having a circular or elliptical shape and first bump pads 616a, 616b, 616c, 616d (collectively 616) having an elongated circular or elliptical shape. However, the present invention is not limited in this regard. In the various embodiments of the present invention, the second bump pads 614 can also have a rounded square shape or a squircle shape (a superellipse having n=4, a=b=1 for the elliptical expression $|x/a|^n+|y/b|^n=1$). The first bump pads 616 can have an elongated version of the same shape.

The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments of the present invention can be made in accordance with the disclosure herein without departing from the spirit or scope of the invention. Thus, the breadth and scope of the present invention should not be limited by any of the above described embodiments of the present invention. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments of the present invention only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. An integrated circuit (IC), comprising:
    a substrate having a semiconducting surface;
    a first array of devices on and in said semiconducting surface, each of said devices in said first array comprising at least first and second coacting current conducting nodes;
    a plurality of layers disposed on said substrate, said plurality of layers comprising a plurality of electrically conductive layers and a plurality of dielectric layers; the substrate having a top dielectric surface;
    a first plurality of bump pads on or in said top dielectric surface, each of the first plurality of bump pads electrically connected to a first coacting current conducting node;
    each of the first plurality of bump pads electrically isolated from all other bump pads of the first plurality of bump pads below the top dielectric surface;

the first plurality of bump pads forming a linear array enabling the first plurality of bump pads to form physical joints to a first common contact band external to the substrate;

a second plurality of bump pads on or in said top dielectric surface, each of the second plurality of bump pads electrically connected to a second coacting current conducting node;

each of the second plurality of bump pads electrically isolated from all bump pads of the first plurality of bump pads and all other bump pads of the second plurality of bump pads below the top dielectric surface; and the second plurality of bump pads forming a linear array enabling the second plurality of bump pads to form physical joints to a second common contact band external to the substrate, the second common contact band separated from and parallel to the first common contact band.

2. The IC of claim 1, further comprising:

a second array of devices on and in said semiconducting surface. having a third and a fourth coacting current conducting node;

a third plurality of bump pads on or in said top surface, a third plurality of bump pads on or in said top dielectric surface, each of the third plurality of bump pads electrically connected to the third coacting current conducting node;

wherein said plurality of electrically conductive layers further define a plurality of electrical traces electrically coupling at least one of said second array of devices to a control node of said second array of devices the third plurality of bump pads forming a linear array enabling the third plurality of bump pads to form physical joints to a third common contact band external to the substrate, the third common contact band separated from and parallel to the first common contact band and the second common contact band.

3. The IC of claim 2, wherein said first plurality of devices are disposed on and in at least a first device region of said substrate, said second plurality of devices are disposed on and in at least a second device region of said substrate, and said first and said second device regions are non-overlapping.

4. The IC of claim 3, wherein said first plurality of bump pads disposed above said first device region, and said second plurality of bump pads disposed above said second device region.

5. The IC of claim 2, wherein said first plurality of devices comprise high current transistors, and said second plurality of devices comprise high current transistors.

6. The IC of claim 2, further comprising a fourth plurality of bump pads on or in said top dielectric surface, each of the fourth plurality of bump pads electrically connected to the fourth coacting current conducting node, and forming a linear array enabling the fourth plurality of bump pads to form physical joints to a fourth common contact band external to the substrate separated from and parallel to the third common contact band.

7. The IC of claim 6, in which the fourth common contact band is an extension of the second common contact band.

8. The IC of claim 2, further comprising a logic portion, which provides control signals to the first array of devices and to the second array of devices.

9. The IC of claim 8, further comprising interconnects connecting the logic portion to a fifth plurality of bump pads placed at edges of the substrate.

10. The IC of claim 9, in which the fifth plurality of bump pads are smaller than the first and second plurality of bump pads.

11. An integrated circuit (IC) device, comprising:

a functional die comprising a substrate having a semiconducting surface, a first array of devices on and in said semiconducting surface, each of said devices in said first array comprising at least first and second coacting current conducting nodes, a plurality of layers disposed on said substrate, said plurality of layers comprising a plurality of electrically conductive layers and a plurality of dielectric layers having a top surface, and a first plurality of bump pads on or in said top surface of said plurality of dielectric layers, wherein said plurality of electrically conductive layers comprise a first plurality of electrical traces, wherein at least a first portion of said first plurality of electrical traces electrically contact at least a first portion of said first plurality of bump pads exclusively to at least a portion of said first coacting current conducting nodes, wherein at least a second portion of said first plurality of electrical traces electrically contact at least a second portion of said first plurality of bump pads exclusively to at least a portion of said second coacting current conducting nodes, and wherein said first plurality of electrical traces are electrically isolated from one another by said plurality of dielectric layers; and a workpiece having a workpiece surface facing said top surface, said workpiece comprising a plurality of electrically conductive contacts disposed on said workpiece surface, said plurality of electrically conductive contacts comprising a plurality of contact bands, each of said plurality of contact bands extending over at least a portion of said workpiece surface, each of said plurality of contact bands at least partially overlapping at a location of at least two bump pads of said first plurality of bump pads, and each of said plurality of contact bands physically and electrically contacting a portion of said first plurality of bump pads.

12. The IC device of claim 11, wherein said functional die further comprises: a second plurality of devices on and in said semiconducting surface, and a second plurality of bump pads on or in said top surface at a second plurality of bump pad locations, wherein said plurality of electrically conductive layers further define a second plurality of electrical traces, said second plurality of electrical traces electrically coupling at least one of said second plurality of devices to a control node of said first array of devices, wherein said first and said second plurality of electrical traces are electrically isolated.

13. The IC device of claim 12, wherein said first array of devices are disposed on and in at least a first device region of said substrate, said second plurality of devices are disposed on and in at least a second device region of said substrate, and said first and said second device regions are non-overlapping.

14. The IC device of claim 13, wherein said first plurality of bump pads are disposed above said first device region, and said second plurality of bump pads are disposed above said second device region.

15. The IC device of claim 12, wherein said plurality of electrical conductive contacts further comprises a plurality of contact pads, each of said plurality of contact pads extending over at least a portion of said workpiece surface to at least partially overlap one of said second bump pad locations.

16. The IC device of claim 15, wherein said each of said plurality of contact bands extends along a first directional axis to at least one edge of said workpiece surface.

17. The IC device of claim 12, wherein said first plurality of bump pads have at least twice the area of said second plurality of bump pads.

18. The IC device of claim 12, wherein said second plurality of bump pads are patterned in a first shape and said first plurality of pads are patterned in a second shape, said second shape comprising an elongated version of said first shape.

19. The IC device of claim 11, wherein said first portion of said first plurality of bump pads are disposed on said top surface along at least a first directional axis, said second portion of said first plurality of bump pads are disposed on said top surface along at least a second directional axis, and said first and said second directional axes being non-intersecting in an area defined by said top surface.

* * * * *